United States Patent [19]

Rousseau et al.

[11] Patent Number: 4,507,382

[45] Date of Patent: Mar. 26, 1985

[54] WATER DEVELOPABLE POSITIVE ACTING LITHOGRAPHIC PRINTING PLATE

[75] Inventors: Alan D. Rousseau, Stillwater; Elsie A. Fohrenkamm, St. Paul; William L. Kausch, Cottage Grove, all of Minn.

[73] Assignee: Minnesota Mining and Manufacturing Company, St. Paul, Minn.

[21] Appl. No.: 471,808

[22] Filed: Mar. 3, 1983

[51] Int. Cl.$^3$ .............................................. G03F 7/10
[52] U.S. Cl. .................................. 430/275; 430/271; 430/283; 430/288; 430/302; 430/916
[58] Field of Search ............... 430/287, 283, 302, 303, 430/916, 288, 271, 275; 101/466

[56] References Cited

U.S. PATENT DOCUMENTS

| | | | |
|---|---|---|---|
| 3,016,823 | 1/1962 | Thurlow | 430/302 X |
| 3,085,008 | 4/1963 | Case | 96/75 |
| 3,419,394 | 12/1968 | Bach | 96/75 |
| 3,867,147 | 2/1975 | Teuscher | 96/33 |
| 4,079,025 | 3/1978 | Young et al. | 536/50 X |
| 4,147,549 | 4/1979 | Held | 96/85 |
| 4,196,065 | 4/1980 | Gaussens et al. | 204/159.15 X |
| 4,198,236 | 4/1980 | Held | 430/306 |
| 4,264,705 | 4/1981 | Allen | 430/302 X |
| 4,304,923 | 12/1981 | Rousseau | 560/26 |

FOREIGN PATENT DOCUMENTS 7103065Q  3/1970  Netherlands ....................... 430/302

*Primary Examiner*—John E. Kittle
*Assistant Examiner*—Cynthia Hamilton
*Attorney, Agent, or Firm*—Donald M. Sell; James A. Smith; David L. Weinstein

[57] ABSTRACT

Water-developable positive acting lithographic printing plate. The plate is prepared by first coating a substrate with an oleophilic composition, drying and curing the composition to form an insoluble adhering oleophilic layer and then overcoating said oleophilic layer with a water soluble photopolymerizable composition. Upon imagewise exposure of the plate, the photopolymerizable composition polymerizes in the non-image areas. Upon development with ordinary tap water, the unpolymerized image areas of the photopolymerizable composition are washed away, leaving an oleophilic surface in the image areas and a hydrophilic surface in the background.

11 Claims, No Drawings

WATER DEVELOPABLE POSITIVE ACTING LITHOGRAPHIC PRINTING PLATE

BACKGROUND OF THE INVENTION

This invention relates to lithographic printing plates and to water-developable, positive acting lithographic printing plates.

Positive acting water developable lithographic printing plates having a photopolymerizable light-sensitive layer are known in the art. Such plates are described, for example, in U.S. Pat. Nos. 4,147,549 and 4,198,236. More particularly, these plates comprise a support, a photosensitive layer or stratum and may have a strippable protective cover layer. The photosensitive layer contains an oleophilic polymer binder which is substantially insoluble in the water developer, a water soluble, ethylenically unsaturated monomer capable of undergoing photoinitiated addition polymerization to form a hydrophilic polymer which is substantially insoluble in the water developer, and an effective amount of a polymerization initiator activatable by actinic radiation and inactive thermally below 85° C. To prepare a positive-working planographic printing plate useful in offset lithography the element is exposed to actinic radiation through a process positive transparency, the protective cover layer is stripped away and the surface of the exposed stratum is washed with water which leaches monomer from the unexposed areas of the stratum. The resulting stratum contains a positive image made up from an oleophilic ink receptive surface from which the monomer has been leached and a complementary, hydrophilic surface comprised of the hydrophilic polymer formed. U.S. Pat. Nos. 3,867,147, 3,085,008 and 3,419,394 relate to lithographic plates comprising an oleophilic layer overcoated with a water-soluble hydrophilic material mixed with a diazo compound, said diazo compound being light sensitive and decomposable so as to effect crosslinking in the hydrophilic material. Upon curing, the hydrophilic polymer becomes water-insoluble but remains hydrophilic.

Although the above-mentioned patents are several years old, as yet, no positive acting water-developable lithographic printing plate is commercially available because wet strength, scratch resistance, and solvent resistance are features for which problems still exist in the current art. Moreover, the state of the art requires gumming or similar types of post treatment or special fountains in order to maintain hydrophilicity of plates after development.

Water developable positive acting lithographic printing plates which employ diazo oxide resin chemistry systems are not favored because of severe light sensitivity problems after development. Because of the nature of the photosolubilization mechanism a water-developable plate coating exposed to actinic radiation after development, during mounting, or running on the press will become soluble in the water based press fountain and will dissolve away. Even if a developed plate could be rigorously protected from light, it is doubtful whether a conventional resin system, when combined with diazo oxide, could provide the water-solubility differential required for clean development and yet be durable when subjected to water on the printing press.

A significant amount of lithographic printing is done from aluminum plates. The aluminum plates are generally grained or roughened prior to coating or processing. This can be done in a flat, circularly oscillating tub by means of steel "marbles", abrasive grit, and water, but it can also be done by dry grit blasting, or brush graining using nylon or steel brushes and abrasive. Grain depth usually varies from 0.5 to 2.5 micrometers. The plate grain provides anchorage for the coating and the ink and recesses that help the surface carry moisture.

It would be advantageous to employ aluminum plates which require a minimum of graining or roughening prior to being coated. It would be even more advantageous to be able to use a plate material made of a synthetic polymeric material, such as polyester. However, adhesion to synthetic polymeric materials by photosensitive layers is a problem that limits durability, i.e. run length, of lithographic printing plates made of polymeric materials.

SUMMARY OF THE INVENTION

The water developable positive acting lithographic printing plate of this invention comprises a substrate formed of a thin sheet material having overlying at least one surface thereof an oleophilic layer. The surface roughness (i.e., arithmetic average roughness) of the composite of the substrate and oleophilic layer, as measured over the surface of the oleophilic layer, should be no lower than 25 microinches (0.64 micrometer). Overlying the oleophilic layer is a layer of a water soluble photopolymerizable composition. Upon exposure of the plate to actinic radiation through a positive transparency, the exposed light-reacted portions of the photopolymerizable composition become insolubilized and firmly bonded to the underlying oleophilic layer, while remaining hydrophilic. In the unexposed areas, the light-sensitive composition remains soluble and can easily be washed away with water to bare the underlying oleophilic layer, in which layer is provided the image areas of the plate.

The substrate may be formed from a thin sheet of metal, polymeric material, or any other material which is conventionally employed as a substrate for lithographic printing plates. The oleophilic layer may be formed from a composition comprising a photopolymerizable material, preferably an ethylenically unsaturated urethane oligomer, and a photoinitiation system. If the substrate exhibits a surface roughness of less than about 25 microinches (0.64 micrometer), the oleophilic layer must impart sufficient degree of roughness to the composite of the substrate and oleophilic layer so that the surface roughness of the composite, as measured over the surface of the oleophilic layer, is at least 25 microinches (0.64 micrometer). This degree of roughness can be brought about by adding particulate material to the composition for preparing the oleophilic layer.

The hydrophilic photopolymerizable layer is formed from a composition comprising an acrylamidomethyl dextrin oligomer, at least one hydroxyfunctional acrylamide monomer, inorganic particulate material, and a photoinitiation system.

The lithographic printing plate of this invention is durable, even when the substrate is formed of a polymeric material. The plate has no post-development sensitivity to white fluorescent light, and it requires no gumming or desensitization of any kind after development with ordinary tap water.

DETAILED DESCRIPTION

The lithographic printing plate of the present invention may employ any of a variety of diverse materials for the substrate. The substrate is generally in the form of a sheet, preferably having a thickness in the range of about 6 to about 20 mils (0.15–0.50 mm). Suitable materials include metals that are conventionally employed for lithographic plates. Polymeric materials are also suitable for the substrate. Aluminum is the preferred metal on the basis of cost and handling properties. Zinc, copper, lead, tin, and steel, though less desirable than aluminum, can also be employed. Polymeric materials, such as, for example, polyesters and polyolefins, may be used in place of metals. The substrate may be relatively smooth, or it may be roughened. A relatively smooth substrate is one that exhibits an arithmetic average roughness of below about 25 microinches (0.64 micrometer). A roughened substrate, i.e. one that exhibits an arithmetic average roughness of at least about 25 microinches (0.64 micrometer), generally refers to a metallic substrate, such as, for example, aluminum, which has been chemically etched. The chief characteristic of the material of the substrate is that it must adhere strongly to the oleophilic layer, which will be described below.

The oleophilic layer must bond strongly to the substrate, must be insoluble in press solvents and inks, and must provide a good foundation for adhesion of the hydrophilic top layer. Addition polymerizable compounds containing ethylenic unsaturation can be used for the oleophilic layer of this invention. Materials useful for preparing the oleophilic layer may be simple compounds (i.e., monomers) containing ethylenic unsaturation, as well as oligomers and polymers containing end groups or pendent groups terminating with ethylenic unsaturation.

If a relatively smooth substrate is employed, a suitable composition for preparing the oleophilic layer can comprise from about 40 to about 60 weight percent ethylenically unsaturated compound, from about 40 to about 60 weight percent inorganic solid particulate material having an average particle size of about 1 to about 10 micrometers, from about 2 to about 10 weight percent photoinitiation system, and from about 0 to about 2 weight percent adhesion promoter. The composite formed from the relatively smooth substrate and oleophilic layer must have an arithmetic average roughness of at least 25 microinches (0.64 micrometer), as measured over the surface of the oleophilic layer by a surface roughness measuring device. In this application, the measuring device employed was a Surfanalyzer ™, manufactured by Federal Products, Incorporated, hereinafter referred to as Surfanalyzer ™.

One class of materials useful for preparing an oleophilic composition which fulfills the bonding requirements of the oleophilic layer are ethylenically unsaturated oligomers having the following formula:

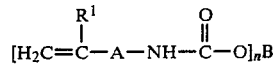

wherein:
R¹ is hydrogen or methyl;
A is a divalent aliphatic radical selected from —R²— —and

in which R² is an alkylene radical having 1 to about 6 carbon atoms or a 5- or 6-membered cycloalkylene radical having 5 to about 10 carbon atoms, said aliphatic radical optionally containing 1 to 2 catenary oxygen atoms or

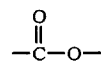

groups;
B is a backbone which is a polyvalent radical obtained by removal of the hydroxyl groups from a polyester polyol, polyether polyol, or polyacrylate polyol, said polyols having at least 4 hydroxyalkyl or hydroxycycloalkyl groups per molecule, a hydroxyl equivalent weight of about 75 to 1000, and a molecular weight of about 300 to 5000, and n is 4 to about 15.

This oligomer and its method of preparation is disclosed in assignee'3 copending application, Hegel, U.S. Ser. No. 270,841, filed June 5, 1981, herein incorporated by reference. The oligomer may be prepared by the following procedure:

Into a reaction flask equipped with an agitator, liquid addition funnel, thermometer, and inlet tube for the introduction of a dry nitrogen atmosphere is placed 600 g (0.6 mole) of "Lexorez" 5171-280 (a polyester polyol derived from trimethylolpropane, dipropylene glycol, adipic acid, and phthalic anhydride, having a hydroxyl functionality of 5 to 7, and hydroxyl equivalent weight of 280, commercially available from Inolex Corporation), 1.5 g dibutyltin dilaurate, and 2.1 g "Irganox" 1010 antioxidant ((tetrakis)3-(3,5-di(t-butyl)-4-hydroxyphenyl) propionyloxymethyl)methane, commercially avalable from Ciba Geigy Inc.). The resulting mixture is agitated, and 465 g (3.0 moles) of 2-isocyanatoethyl methacrylate is added to the reaction flask over a 30 minute period, with the rate of addition of the 2-isocyanatoethyl methacrylate being adjusted to keep the temperature of the reaction mixture from exceeding about 75° C. A heating mantle is placed about the reaction flask, and the reaction mixture is heated for an additional 30 minutes at a temperature of about 70 to 75° C., until infrared analysis of the reaction mixture indicates that the isocyanate groups have been consumed. The reaction product is allowed to cool. The product formed is hereafter designated "Oligomer A" and is represented by the following structural formula:

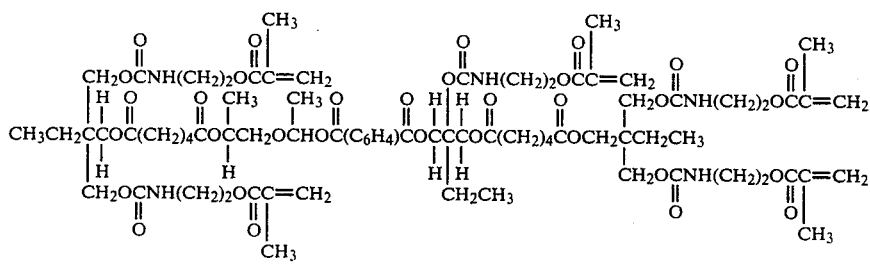

The photinitiation system for this particular oligomer comprises an N-alkylaminoaryl ketone and an iodonium salt. It is preferred that the composition for the oleophilic layer be curable with ultraviolet radiation. Curing by means of ultraviolet radiation is rapid and allows fast coating speeds. An ultraviolet radiationcured oleophilic surface will also exhibit excellent adhesion for the hydrophilic top layer. Accordingly, a photoinitiation system sensitive to ultraviolet radiation is the most effective system for curing the oleophilic layer. However, if the composition for the oleophilic layer is to be cured by heat, electron beams, or some other method, a different photoinitiation system should be employed.

A particularly preferred photoinitiation system comprises (a) Michler's ketone (4,4'-Bis(dimethylamino) benzophenone) and (b) an iodonium salt. Diphenyliodonium hexafluorophosphate is the preferred iodonium salt.

Other examples of useful addition polymerizable compounds containing ethylenic unsaturation include monomeric acrylates (acryloyl containing materials), acrylamides, methacrylates (methacryloyl containing materials), methacrylamides, allyl compounds, vinyl ethers, vinyl esters, N-vinyl compounds, styrenes, and crotonates. These compounds harden upon exposure to ultraviolet radiation.

Free radical initiators for addition polymerizable compounds are known in the art, and are described in references such as Free-Radical Chemistry, D. C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, acyl halides, aryl halides, hydrazones, pyrylium compounds, triarylimidazoles, biimidazoles, chloroalkyltriazines, etc. These materials, in general, must have photosensitizers therewith to form a photoinitiator system. Photosensitizers are well known in the art.

Additional reference in the art to free radical photoinitiator systems for ethylenically unsaturated compounds are included in U.S. Pat. No. 3,887,450 (e.g., column 4), U.S. Pat. No. 3,895,949 (e.g., column 7), and U.S. Pat. No. 4,043,819. Preferred initiators are the onium salts as disclosed in U.S. Pat. Nos. 3,729,313; 4,058,400; and 4,058,401. Other desirable initiators are biimidazoles as disclosed in U.S. Pat. No. 4,090,877 and chloroalkyltriazines as disclosed in U.S. Pat. No. 3,775,113. These references also disclose sensitizers therein. Another good reference to photoinitiator systems is Light-Sensitive Systems, J. Kosar, 1965, J. Wiley and Sons, Inc., especially Chapter 5.

In the situation where the substrate is relatively smooth, i.e., where its arithmetic average roughness is less than about 25 microinches (0.64 micrometer), the composition for preparing the oleophilic layer should have inorganic solid particulate material incorporated therein, so that the resulting oleophilic layer will exhibit sufficient roughness.

Suitable inorganic solid particulate materials include glass spheres, crushed glass, amorphous silica, and quartz. The solid particulate material should have relatively low surface area to allow high loading, i.e. 40 to 60 weight percent, based on the weight of the composition. The inorganic solid particulate material is generally selected on the basis of particle size. The average particle size of the solid particulate material must be sufficiently high to impart an arithmetic average roughness to the oleophilic layer/substrate composite, as measured over the surface of the oleophilic layer, of between about 25 and about 40 microinches (0.64 to 1.00 micrometer). The particle size and concentration of the solid particulate material are critical to the topography of the oleophilic layer. As stated previously, the particle size can range from about 1 to about 10 micrometers, and the concentration can range from about 40 to about 60 weight percent, based on the weight of the composition for forming the oleophilic layer.

If the concentration of solid particulate material is too high, i.e. in excess of about 60 weight percent, the oleophilic layer will exhibit excessive roughness, which may result in blinding, or incomplete development. If the concentration of solid particulate material is too low, i.e. below about 40 weight percent, the oleophilic layer will not adhere well to the substrate and/or to the subsequently applied hydrophilic top layer.

Solid particulate material is not necessary in a composition for the oleophilic layer if the substrate exhibits sufficient roughness to provide adequate anchorage for the overlying oleophilic and hydrophilic layers.

One or more adhesion promoters may be added to the composition for forming the oleophilic layer to enhance the adhesive strength of the composition. The preferred adhesion promoter is methacryloyloxyethyl phosphate. The adhesion promoter can comprise up to about 2 weight percent of the oleophilic composition. For most purposes, the adhesion promoter is not required in the composition.

A method of preparing the composition for the oleophilic layer involves adding to a vessel containing glass marbles, 40 to 60 parts by weight ethylenically unsaturated oligomer, 40 to 60 parts by weight solid particulate material, 2 to 10 parts by weight photoinitiation system, and then ball milling the resulting mixture until the desired degree of dispersion is obtained. In situations where the solid particulate material is thought to change average particle size during milling, the milling is continued until applied coatings exhibit an arithmetic average roughness of 25 to 40 microinches (0.64 to 1.00 micrometer).

Where the substrate exhibits sufficient roughness, as when it has been chemically grained, solid particulate material need not be used in the composition for preparing the oleophilic layer. In that case, the portion of the composition taken up by the solid particulate material can be replaced by the inclusion of additional ethylenically unsaturated compound or polymeric binder. The composite formed from the roughened substrate and the oleophilic layer must have an arithmetic average roughness of at least 25 microinches (0.64 micrometer), as measured over the surface of the oleophilic layer by a Surfanalyzer ™.

A particularly desirable ingredient for preparing the oleophilic layer, when a roughened substrate is used to prepare the lithographic plate, is the ethylenically unsaturated polymerizable oligomer disclosed in Rousseau, U.S. Pat. No. 4,304,923, incorporated herein by reference. The oligomer disclosed in that reference can be prepared by the procedure set forth in Preparation II of that patent. The oligomer prepared by that process is hereinafter referred to as "Polymethacrylated Urethane Oligomer B".

Conventional milling, mixing and solution techniques can be used in preparing the oleophilic composition, the particular technique varying with the differences in properties of the respective components. Ball milling or dispersion by means of high speed stirring are the preferred techniques when the composition contains inorganic particulate material.

The oleophilic layer may be applied to the substrate by conventional coating techniques, e.g. wire round rod coating or extrusion bar coating. The coating thickness can range from about 3 to about 5 micrometers, and the coating weight can range from about 450 to about 750 mg./ft$^2$ (4.9–8.2 g/m2).

The oleophilic layer should be dried and then exposed to ultraviolet radiation in order to effect a partial cure. Typical drying conditions are about 1-3 minutes at about 47°–64° C. (135°–165° F.). Typical curing conditions may be summarized as follows:

A. Static 20 to 40 seconds at a distance of 20.3 cm (8 inches) from a 5 kW mercury metal halide source;

B. Dynamic

3–6 m/min (10 to 20 ft/min) at a distance of 5.1 cm (2 inches) from a 200 w/inch mercury lamp.

The hydrophilic photopolymerizable layer which overlies the oleophilic layer is prepared from a photosensitive, water-soluble composition, which is fully described in assignee's copending patent application, Ser. No. 471,828 filed Mar. 3, 1983, filed on even date herewith, and incorporated herein by reference. Upon exposure to actinic radiation, the composition must polymerize to a water-insoluble, water-wettable, durable layer having good wet strength and scratch resistance.

The photosensitive, water-soluble composition for preparing the hydrophilic top layer comprises from about 20 to about 60 weight percent acrylamidomethyl dextrin oligomer, from about 10 to about 30 weight percent of at least one hydroxyfunctional acrylamide monomer, from about 10 to about 40 weight percent inorganic solid particulate material, and from about 1 to about 7 weight percent photoinitiation system. In addition, wetting agents can be added to the foregoing composition to promote wetting of the oleophilic layer by aqueous solutions of the hydrophilic composition. Water dispersible pigments can also be added to impart color to the hydrophilic layer. pH modifiers can also be added to the composition in order to stabilize the pigment and solubilize the photosensitizer component of the photoinitiation system.

The ethylenically unsaturated dextrin oligomers suitable for the photopolymerizable composition are fully described in assignee's copending patent application, U.S. Pat. No. 4,451,613, filed on even date herewith, and incorporated herein by reference.

As used in this application, the term "anhydroglucose unit" means a unit having the following structure:

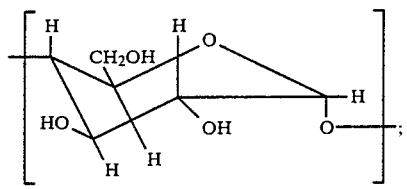

As used in this application, the term "degree of substitution" ("D.S.") means the average value of ethylenically unsaturated moiety per anhydroglucose unit, and the term "dextrin" means a carbohydrate intermediate in chain length between starch and glucose.

The dextrin oligomers contemplated for use in the photopolymerizable composition of this invention comprise the reaction product of
(1) 100 parts by weight of a dextrin compound, said dextrin compound being non-gelling at temperatures up to 98° C. when heated in the presence of water, N-methylolacrylamide, and acid, and
(2) 35 to 70 part by weight of at least one ethylenically-unsaturated monomer capable of reacting with at least one hydroxyl group of the dextrin compound, said oligomer having an average in the range of 0.1 to 0.7, and preferably 0.20 to 0.45, ethylenically-unsaturated moiety per every anhydroglucose unit and an equivalent weight of 440 to 990, and at least 75 weight percent of said oligomer being water-soluble at 20° C. in a concentration of at least 2.5 percent by weight.

The water-soluble ethylenically-unsaturated dextrin oligomers have the formula

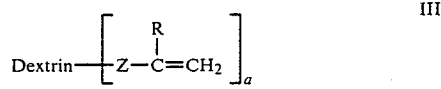

wherein
"Dextrin" is a carbohydrate intermediate in chain length between starch and glucose,
Z is a divalent organo group linking the terminal ethylenically-unsaturated group to the dextrin chain,
"a" represents the degree of substitution (D.S.) in the range of 0.1 to 0.7,
R is a member selected from the group consisting of hydrogen and lower alkyl radicals, i.e., those containing from 1 to 4 carbon atoms.

Preferably R is hydrogen, a methyl group, or an ethyl group. Preferably, "a" is 0.20 to 0.45.

Examples of ethylenically-unsaturated dextrin oligomers suitable for this invention include:

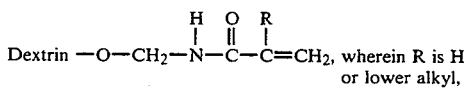 (1)

Dextrin —O—CH$_2$—N—C—C=CH$_2$, wherein R is H or lower alkyl,

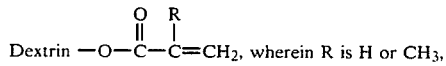 (2)

Dextrin —O—C—C=CH$_2$, wherein R is H or CH$_3$,

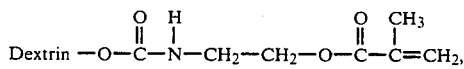 (3)

Dextrin —O—C—N—CH$_2$—CH$_2$—O—C—C=CH$_2$,

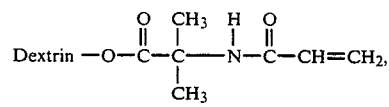 (4)

Dextrin —O—C—C—N—C—CH=CH$_2$,

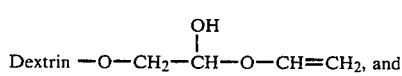 (5)

Dextrin —O—CH$_2$—CH—O—CH=CH$_2$, and

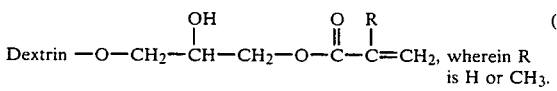 (6)

Dextrin —O—CH$_2$—CH—CH$_2$—O—C—C=CH$_2$, wherein R is H or CH$_3$.

Z is a divalent organo linking group comprising a small number of carbon, nitrogen, and oxygen atoms (preferably 8 atoms or less) and as high a ratio of hetero atoms (nitrogen, oxygen) to carbon atoms as possible. Examples of Z include:

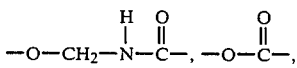

—O—CH$_2$—N—C—, —O—C—,

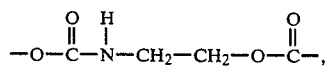

—O—C—N—CH$_2$—CH$_2$—O—C—,

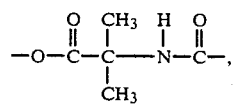

—O—C—C——N—C—,

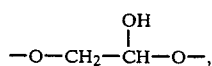

—O—CH$_2$—CH—O—,

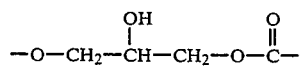

—O—CH$_2$—CH—CH$_2$—O—C—,

The preferred Z has the following structure:

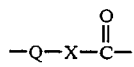

—Q—X—C— where Q is a divalent organo group preferably having 6 atoms or less with as high a ratio of hetero atoms (nitrogen, oxygen) to carbon atoms as possible and X is N—H or O. The most preferred Z has the structure

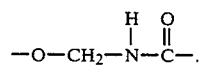

—O—CH$_2$—N—C—.

Dextrins are produced from starch by hydrolysis with dilute acids, amylase, or dry heat, in the presence of an acid catalyst so as to produce fragments of molecular weight lower than that of the original starch. The ethylenically unsaturated dextrin oligomers to be used in the present invention can be prepared by the following general method:

A. To a glass or glass-lined reaction vessel fitted with an agitator, an overhead condenser suitable for distillation, a temperature control, and an inert air sweep, is added 35 to 70 parts by weight of N-methylolacrylamide 60 to 120 parts by weight of water, 1 to 6 parts by weight of acrylic acid or other carboxylic acid catalyst and .0002 to .0006 parts by weight of a free radical polymerization inhibitor such as phenothiazine.

B. To this mixture is added, with agitation, 100 parts by weight of a suitable dextrin.

C. The mixture is agitated until uniform and then heated to 82°–98° C. with an inert air sweep.

D. When 30 to 60 parts by weight of water has been distilled and collected, the batch is cooled to about 27° C. and 75 to 150 parts by weight of deionized water is added.

E. The cool solution is filtered and added with agitation during a 10 to 20 minute period to 1200 to 2400 parts by weight of methanol in a glass or glass lined vessel.

F. The product is filtered and vacuum or forced air dried for several days, until the weight remains unchanged, to give 110 to 210 parts by weight of a chunky white solid.

G. The product is analyzed for residual monomer and incorporated unsaturation using proton and $^{13}$C nmr spectroscopy. Alternatively, residual monomer can be analyzed for by using a 300 mm×7.8 mm HPLC (high performance liquid chromatography) carbohydrate analysis column (Aminex ® Carbohydrate HPX042, BioRad Corp.).

The incorporated unsaturation from reacted monomer can vary from 20 to 45 mole percent, and unreacted monomer is usually found to be less than one weight percent. This means that it is possible to make dextrin oligomers with equivalent weights of unsaturation of 440 to 990.

The dextrins which can be used for preparing the oligomers useful in the present invention are those which will not gel when heated with acrylic acid and N-methylol acrylamide.

Commercially available dextrins which are suitable for preparing the oligomers to be used in the present invention include Amaizo ® 1407, Amaizo ® 1740, and Amaizo ® 1895, available from American Maize Products Co., Stadex ® 27, Stadex ® 50, and Stadex ® 140, available from A. E. Staley Manufacturing Co., and Excello ® 8051, available from Corn Products Company.

Monomers useful in preparing the photopolymerizable composition are free-radical initiated, chain propagating, addition polymerizable, ethylenically unsaturated compounds which are substantially soluble in water and which, upon photoinitiated polymerization with themselves or with the above described ethylenically unsaturated dextrin oligomer, form hydrophilic polymers which are substantially insoluble in water. Particularly preferred monomers of this type are those which contain both hydroxyl and acrylamide groups. Examples of suitable monomers include N-methylolacrylamide, dihydroxyethylenebis-acrylamide, 1,4-diacrylamido-2,3-dihydroxybutane, 1,3-diacrylamido-2- hydroxypropane, and 1-acrylamido-2,3-dihydroxypropane. The purpose of the hydroxy functional monomers is to (a) promote cross-linking of the ethylenically unsaturated dextrin oligomer and to (b) plasticize the composition. Preferably, more than one monomer is employed, because it has been found that the use of more than one monomer minimizes the tendency of monomers to crystallize in the dry coating.

The solid particulate material should be inorganic and preferably should have a relatively high surface area, e.g., 200–400 m$^2$/g. The particulate material not only contributes to the wet strength and scratch resistance of the polymerized composition, but it also helps to reduce the tack of the photosensitive element under conditions of high humidity. The particulate material should be inorganic in order to be compatible with the other ingredients of the hydrophilic photopolymerizable composition. The preferred particulate materials are silicas, the most preferred being medium to low density silica gels. Commercially available particulate materials useful in the composition include Syloid® 244, manufactured by W. R. Grace & Co., and Silcron® G-100, manufactured by SCM Glidden Pigments.

The photopolymerizable composition is activatable by actinic radiation. Since free-radical generating addition-polymerization initiators activatable by actinic radiation generally exhibit their maximum sensitivity in the ultraviolet range, the radiation source should usually furnish an effective amount of this radiation. Suitable radiation sources include mercury and mercury-metal halide lamps, xenon lamps and carbon arcs.

Free radical generating, addition polymerization initiators suitable for the present invention must be soluble in water. Suitable water-soluble polymerization initiators include, for example, aromatic diazonium salts and aromatic iodonium salts. These materials, in general, must have photosensitizers therewith to form a photoinitiation system.

The photosensitizer compound should be capable of absorbing radiation in the range 320-420 nm and should be water-soluble in order to be useful in an aqueous solution.

The preferred photoinitiation system comprises a photosensitizer compound which is a salt of a compound having the formula

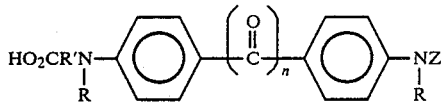

IV wherein
each R is an alkyl group of 1 to 8 carbon atoms,
R' is an alkylene group having 1 to 8 carbons atoms,
Z is R'COOH or R'H, and
n is an integer having a value of 1 or 2.

The foregoing compound is referred as a water-soluble Michler's ketone analog. Water-soluble Michler's ketone analogs and methods for preparation thereof are fully described in assignee's copending patent application, Ser. No. 471,838, filed Mar. 3, 1983, filed on even date herewith, and incorporated herein by reference. In the presence of radiation in the 320–420 nm range, the photosensitizer causes decomposition of known free radical initiators such as iodonium salts, biimidazoles, trialkylphosphites, alkyl peroxides, benzyl halides, alkyl nitrates, and benzophenones into free radicals that initiate polymerization in ethylenically unsaturated materials such as those containing acrylate, methacrylate, acrylamide, and methacrylamide groups, and in allyl and vinyl monomers. The water-soluble Michler's ketone analog can be converted to a salt by the neutralization of the acid form compound of Formula IV, by using inorganic bases, such as metal hydroxides, e.g. NaOH, or organic bases, such as amines, e.g. triethylamine. The salt has the formula

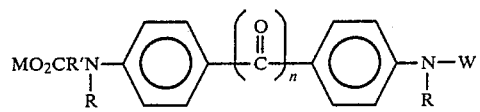

V wherein
R, R' and n are defined as above,
M is a cation (e.g., an alkali or alkaline earth metal ion or a substituted alkyl ammonium ion such as a trialkylammonium ion or hydroxyalklammonium ion), and
W is R'COOM or R'H.

The preferred photosensitizer is the sodium salt

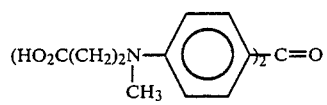

VI 4,4'-bis(N-2-carboxyethyl-N-methylamino)benzophenone.

When n is equal to 1, the photosensitizers may be prepared by the following procedure:

(1) reacting equivalent amounts of the appropriate substituted aniline compound and methyl acrylate at a temperature of 110° C. for 72 hours in the presence of a catalytic amount of acetic acid, (2) purifying the reaction product by distillation, (3) condensing one equivalent of the reaction product with 2 equivalents of formaldehyde by heating at 80° C. for 17 hours in the presence of mineral acid, such as HCl, and a low molecular weight alcohol, having the same alkyl group as the acrylate, to produce the bis compound reaction product, (4) oxidizing one equivalent of the bis reaction product with two equivalents of 2,3-dichloro-5,6-dicyano1,4-benzoquinone (DDQ) by heating to reflux for one hour, (5) hydrolyzing the resulting keto-diester for one hour in the presence of sodium hydroxide and methanol to liberate the carboxyl group, (6) neutralizing the product of step (5) with dilute sulfuric acid to obtain the free acid in crystalline form.

To obtain the salt form of the water-soluble Michler's ketone analog, the compound of step (6) can be neutralized with an inorganic or organic base.

Appropriate aniline compounds for step (1) can be represented by the formula:

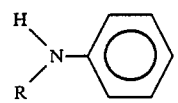

VII wherein R is an alkyl group of 1 to 8 carbon atoms.

The preferred photoinitiation system is a combination of at least one diaryliodonium salt and at least one water-soluble Michler's ketone analog. A particularly preferred photoinitiator is the combination of diphenyliodonium hexafluorophosphate and 4,4'-bis (N-2-carboxyethyl-N-methylamino) benzophenone disodium salt.

Small amounts of water dispersible pigments, i.e., about 1 to about 10 weight percent, based on the weight of the hydrophilic composition, can be added to the photopolymerizable composition to impart color to the photopolymerized layer so that a visible image of the photopolymer is provided. This visible image is useful for providing contrast between the background area and the image area. A preferred pigment is Colanyl Red, available from American Hoechst Corp., because it is compatible with the other components of the composition.

The photopolymerizable composition can also contain wetting agents, e.g. surfactants or alcohols, in order to wet the oleophilic surface upon which the hydrophilic composition is being coated. A commercially available wetting agent is Triton® X-100, an octylphenoxy polyethoxy ethanol, available from Rohm and Haas Co.

The pH of the coating solution may require adjustment in order to stabilize the pigment and keep the photosensitizer soluble. Suitable pH adjusters include amines and inorganic hydroxides.

The concentration range of each ingredient in the photopolymerizable composition of the present invention per 100 parts total is as follows:

20 to 60 parts by weight of ethylenically unsaturated dextrin oligomer,
10 to 30 parts by weight of at least one hydroxyfunctional acrylamide monomer,
10 to 40 parts by weight of inorganic solid particulate material, and
1 to 7 parts by weight of photoinitiation system.

Preferably, the photopolymerizable composition contains, per 100 parts total weight, 30 to 50 parts by weight of ethylenically unsaturated dextrin oligomer, 15 to 25 parts by weight of at least one hydroxy functional acrylamide monomer, 20 to 30 parts by weight of inorganic solid particulate material, and 1 to 7 parts by weight of photoinitiation system. As stated previously, the photoinitation system includes a photosensitizer and an initiator. The photoinitiation system preferably contains about 1 to about 5 parts by weight of initiator and about 1 to about 5 parts by weight of photosensitizer.

To combine the ingredients to form the photopolymerizable composition, all water-soluble components of the composition are dissolved in water, preferably with mechanical stirring. The solid particulate material can be ball milled with the aqueous solution of the water-soluble components to form a dispersion.

The foregoing hydrophilic polymerizable composition is applied as a top coat over an oleophilic layer, which has been previously applied to a suitable substrate. Suitable substrates include metals, such as aluminum, or polymeric films, such as polyester films. The hydrophilic composition of this invention may be applied by skim coating, wire wound rod coating, extrusion bar coating, or other conventional coating technique. After the solvent, water, has evaporated, the element is ready for use.

To prepare a positive acting lithographic printing plate, the element may be exposed through a process positive transparency in a vacuum frame under a source of ultraviolet light. After exposure, the plate can be developed by wiping with water, which dissolves and removes the unpolymerized coating composition.

The thus-formed lithographic plate has no post development sensitivity to white fluorescent light. This characteristic is valuable because press durability, run length, and solvent resistance are not diminished by exposure to room lights after processing. Furthermore the plate needs no gumming or desensitization of any kind after development with ordinary tap water. The photopolymer background retains its hydrophilicity even after long periods of storage.

The plate of this invention requires about one-fourth to about one-half of the exposure of a diazo-oxide phenolic based conventional state of the art positive plate.

Based on accelerated press testing, it is estimated that the average run length of the plate of this invention when prepared with a slurry brush grained (unanodized) aluminum substrate would be in excess of 50,000 impressions.

The invention will now be further illustrated by the following, non-limiting, examples.

EXAMPLE I

The following ingredients, in the amounts indicated, were employed for preparing the oleophilic layer:

| Ingredient | Amount |
| --- | --- |
| Ethylenically unsaturated urethane oligomer (Oligomer A, U.S. Ser. No. 270,841) | 18.4 g |
| Diphenyliodonium hexafluorophosphate | 0.8 g |
| Michler's ketone (4,4'-Bis(dimethylamino)-benzophenone) | 0.8 g |
| Quartz, 8 micrometer ($\mu$m) mean particulate size, treated with 5% gammamethacryloxypropyltrimethoxysilane [$(CH_2=C(CH_3)CO_2(CH_2)_3Si(OCH_3)_3$] | 20.0 g |
| 1,1,2-Trichloroethylene | 20.0 g |
| Methyl ethyl ketone | 20.0 g |

A slurry was prepared by combining the foregoing ingredients in a 200 cc jar and milling with glass marbles for 26.5 hours on a two roll mill. Slurry brush grained aluminum was subbed with this slurry by coating with a #4 wire wound rod, drying one minute at 66° C. (150° F.), and irradiating 40 seconds at a distance of 20.3 cm (8 inches) from a 5 kW mercury metal halide light source.

The following ingredients, in the amounts indicated, were employed for preparing the hydrophilic layer:

| Ingredient | Amount |
| --- | --- |
| Water | 10.0 g |
| 1,3-Diacrylamido-2-hydroxypropane | 1.3 g |
| 2,3-Dihydroxy-1-acrylamidopropane (31% aqueous solution) | 2.1 g |
| Colanyl Red Pigment (50% aqueous dispersion) | 0.67 g |
| Silica gel (Syloid® 244, W. R. Grace & Co.) | 1.95 g |
| Diphenyliodonium hexafluorophosphate | 0.1 g |
| 4,4'-Bis-(N—2-carboxyethyl-N—methylamino)-benzophenone Disodium salt (2% aqueous solution) | 7.7 g |
| Acrylamidomethyl dextrin (D.S. = 0.32, prepared from Stadex® 140) | 3.0 g |

The acrylamidomethyl dextrin for this Example, and for Examples II, III, IV, V, and VI was prepared according to the following procedure:

To a 94.6 liter (25 gallon) glass-lined kettle fitted with an anchor agitator, an overhead condenser suitable for distillation, a temperature control, and an inert air sweep were added 11.1 kg (24.6 lb.) N-methylolacrylamide in 12.1 kg (26.7 lb.) water, 0.72 kg (1.6 lb.) acrylic acid, 7.5 g phenothiazine, and 6.3 kg (14.0 lb.) deionized water. To this mixture 20.7 kg (46 lb.) of the corn-based dextrin, Stadex ® 140, was added with agitation. The mixture was agitated until uniform and then heated to 91° C. (195° F.) with an inert air sweep. When 8.9 kg (19.8 lb.) of water was distilled and collected, the batch was cooled to 27° C. (80° F.) and 23.4 kg (52 lb.) of deionized water added. The cool solution was filtered and added over a 15 minute period to 375 kg (833 lb.) methanol in a 568 liter (150 gal.) glass-lined kettle with agitation. The product was vacuum filtered and dried in trays at 38° C. (100° F.) for several days to give 33.8 kg (75 lb.) of a chunky solid. The product contained 32 percent incorporated N-methylolacrylamide.

The disodium salt of 4,4'-Bis-(N-2-carboxyethyl-N-methylamino)benzophenone for this Example and for the following Examples was prepared by the following procedure:

N-methylaniline (375.2 g, 3.5 moles) was condensed with methyl acrylate (301.4 g, 3.5 moles) in the presence of 35 ml of glacial acetic acid, by heating to 110° C. for 72 hours. The resulting product was isolated by distillation. Spectral analysis indicated the presence of the desired product having the formula

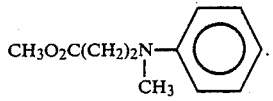

200.0 g (1.03 moles) of the intermediate product obtained above was condensed with 84.0 g (1.0 mole, 2.0 eq.) of 37 percent aqueous formaldehyde in the presence of 13.5 g of concentrated hydrochloric acid and 600 ml of methanol. The mixture was refluxed for 18.5 hours. The reaction product was extracted, washed, and dried. Spectral analysis indicated the presence of the bis compound reaction product having the formula

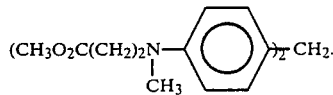

A solution of 8.80 g (0.022) moles of the bis compound reaction product in 20 ml of methanol and 5 ml of chloroform was stirred for 15 minutes and then DDQ (10.0 gm, 0.044 moles) was added over a 5-minute period. The reaction mixture was stirred for 5 minutes at room temperature and for 1 hour at reflux. The keto-diester reaction product was extracted, washed, dried, chromatographed, and then identified by spectral analysis as the compound

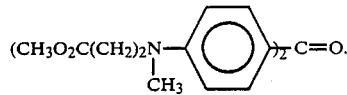

3.51 g (8.51 mmol) of the keto-diester in 125 ml of 10 percent sodium hydroxide/methanol was refluxed for 1 hour and was completely converted to the keto-diacid. The keto-diacid was acidified with aqueous sulfuric acid and the crystals produced were purified by recrystallization from ethanol and identified by spectral and combustion analysis as a compound having the formula

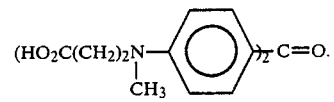

The thus-obtained free acid was dissolved by combining 1.0 g of the acid with 49 g of 0.1 N sodium hydroxide solution and stirring. A small amount of sodium hydroxide solution or photosensitizer was added as needed to adjust the pH to 7.8.

Turning now to the preparation of the hydrophilic layer, the water-soluble ingredients were dissolved in the water. Dispersion of the silica was achieved by milling with glass marbles for about 3 days. The dispersion was coated over the above described subbed aluminum with a wire round rod and dried for two minutes at 66° C. (150° F.). The dry coating weight was about 4.12 g/m² (385 mg/ft²).

The resulting plate was exposed through a 21 step sensitivity guide for 5 seconds in a Berkey Ascor Vacuum Printer and then developed with water.

A ghost step 7 was observed and the weight loss of coating on development was determined to be 5%. "Ghost step" is the lowest exposure step where an image is visibly discernible from the background. Clearly, the coating was almost completely insoluble in water after irradiation.

EXAMPLE II

A 2% stock solution of photosensitizer was prepared by combining 1.0 g of 4,4'-bis(N-2-carboxyethyl-N-methylamino)benzophenone with 49 g of 0.1 N sodium hydroxide solution and stirring. A small amount of additional sodium hydroxide or photosensitizer was added to adjust the solution to pH 7.8. A solution was prepared by stirring 6.0 g acrylamidomethyl dextrin (D.S. =0.32, prepared from Stadex ® 140), 54 g water, 2.6 g 1,3-diacrylamido-2-hydroxypropane and 4.2 g of a 31% aqueous solution of 1-acrylamido-2,3-dihydroxypropane until all components were dissolved. The pH was adjusted to 8.0 using aqueous ethanolamine, and the solution was filtered through Miracloth ®. To this solution were added 3.9 g silica gel (Syloid ® 244), 1.8 g Colanyl Red pigment (50% solids) and 0.04 g octylphenoxy polyethoxy ethanol (Triton ® X-100). The mixture was placed in a jar containing glass marbles and milled for four days. After this time 15.4 g of the 2% photosensitizer solution described above and 0.2 g diphenyliodonium hexafluorophosphate were added to the milled composition. This final dispersion was milled an additional 2 hours before coating. It will be referred to as Dispersion A.

The following ingredients, in the amounts indicated, were employed for preparing the oleophilic layer:

| Ingredient | Amount |
| --- | --- |
| Ethylenically unsaturated urethane oligomer (Oligomer A, U.S. Ser. No. 270,841) | 9.2 g |
| Diphenyliodonium hexafluorophosphate | 0.4 g |
| Michler's ketone (4,4'-Bis(dimethylamino)-benzophenone) | 0.4 g |
| 1,1,2-Trichloroethylene | 10.0 g |
| Methyl ethyl ketone | 10.0 g |

-continued

| Ingredient | Amount |
| --- | --- |
| Quartz, 8 μm mean particle size, treated with 5% gamma-methacryloxypropyltrimethoxysilane [(CH$_2$=C(CH$_3$)CO$_2$(CH$_2$)$_3$Si(OCH$_3$)$_3$] | 10.0 g |

A slurry was prepared by combining the foregoing ingredients in a jar and milling for 54 hours on a roller mill. The resulting slurry was coated on slurry brush grained aluminum having an arithmetic average roughness of about 15 microinches (0.38 micrometer) with a #3 wire wound rod and dried for 2 minutes at 66° C. (150° F.). The dry coating weight was determined to be 5.35 g/m$^2$ (500 mg/ft$^2$). This coating was cured by irradiation for 40 seconds at a distance of 20.3 cm (8 inches) from a 5 kW mercury metal halide lamp. The cured coating had an arithmetic average roughness of 35 microinches (0.89 micrometer).

Dispersion A was coated over the above substrate with a #10 wire wound rod and dried 2 minutes at 66° C. (150° F.). The dry coating weight was about 3.21 g/m$^2$ (300 mg/ft$^2$). The two layer construction was exposed for 3 seconds through a 21 step sensitivity guide in a Berkey Ascor Vacuum Printer and developed with water. A ghost step 6 was observed.

EXAMPLE III

A solution was prepared by stirring 3.0 g acrylamidomethyldextrin (D.S. =0.32, prepared from Stadex ® 140), 27 g water, 1.3 g of 1,3-diacrylamido-2-hydroxypropane, and 2.1 g of a 31% aqueous solution of 1-acrylamido-2,3-dihydroxypropane until the solids were dissolved. The pH was adjusted to about 8.5 with 10% aqueous triethylamine, and the solution was filtered through Miracloth ®. To this solution were added 0.2 g of 10% aqueous solution of octylphenoxy polyethoxy ethanol (Triton ® X-100), 0.9 g of Colanyl Red pigment (50% solids) and 1.93 g of silica gel (Syloid ® 244). The resulting mixture was milled 2 ½ days with glass marbles. After this time, 7.7 g of a 2% 4,4'-bis(N-2-carboxyethyl-N-methylamino)benzophenone disodium salt solution (pH 8) along with 0.1 g diphenyliodonium hexafluorophosphate were added to the dispersion.

Two slurries, Slurry A and Slurry B, were prepared by combining the following ingredients in the amounts indicated.

| Ingredient | Amount, grams | |
| --- | --- | --- |
| | Slurry A | Slurry B |
| Ethylenically unsaturated urethane oligomer (Oligomer A, U.S. Ser. No. 270,841) | 9.1 | 9.1 |
| Diphenyliodonium hexafluorophosphate | 0.4 | 0.4 |
| Michler's ketone (4,4'-Bis(dimethylamino)-benzophenone) | 0.4 | — |
| 2-(p-hydroxyethoxystyryl)-4,6-bis(trichloromethyl)-s-triazine | — | 0.4 |
| 2-methacryloyloxyethyl-phosphate | 0.1 | 0.1 |
| 1,1,2-Trichloroethylene | 10.0 | 10.0 |
| Methyl ethyl ketone | 10.0 | 10.0 |
| Quartz, 8 μm mean particle size, treated with 5% gamma-methacryloxypropyltrimethoxy silane | 10.0 | 10.0 |

The slurries were prepared by combining the listed ingredients and milling with glass marbles for about 24 hours on a roller mill.

Each slurry was coated on a separate slurry brush grained aluminum plate with a #5 wire round rod, dried two minutes at 66° C. (150° F.) and irradiated 40 seconds at a distance of 20.3 cm (8 inches) from a 5 Kw mercury metal halide lamp. The arithmetic average roughness of the cured coatings was 35–40 microinches (0.89-1.02 micrometer), as measured with a Surfanalyzer ™.

The previously prepared dispersion was applied over the coating formed from slurry A and over the coating formed from slurry B. The top coatings were dried for two minutes at 66° C. (150° F.) to give a coating weight of 3.00 g/m$^2$ (280 mg/ft$^2$). The coated plates were then contact exposed through positive lith film with a range of half tone dots and a 21 step sensitivity guide. Plates from slurry A were given a 5.3 second exposure and plates from slurry B a 3 second exposure. After development with water, a ghost step 6 was obtained. Plates were mounted on a Miehle sheet feed press and an abrasive ink was used to print multiple copies. After 33,000 impressions the only sign of wear was a darkening in the 95 and 97% screens. There was no wear in the midtones, highlites, or solid image area.

EXAMPLE IV

The following ingredients, in the amounts indicated, were employed for preparing the oleophilic layer:

| Ingredient | Amount |
| --- | --- |
| Ethylenically unsaturated urethane oligomer (Oligomer A, U.S. Ser. No. 270,841) | 109.6 g |
| Michler's ketone (4,4'-Bis(dimethylamino)-benzophenone) | 4.0 g |
| Diphenyliodonium hexafluorophosphate | 4.0 g |
| Amorphous silica, 2.20 μm mean particle size, (Imsil ® A-10, Illinois Minerals Company) | 100.0 g |
| Methyl ethyl ketone | 122.0 g |
| N—propyl alcohol | 107.7 g |
| Water | 42.3 g |

A slurry was prepared by stirring the ingredients for about 3 hours using an air stirrer. The slurry was coated onto (poly)vinylidene chloride primed polyester, 7 mils in thickness, with a #9 wire wound rod and dried 2 minutes at 66° C. (150° F.). The dried coating was irradiated 40 seconds at a distance of 20.3 cm (8 inches) from a 5 kW mercury metal halide lamp. The arithmetic average roughness of the cured coating was 32–34 microinches (0.81-0.86 micrometer). This substrate was overcoated with the aqueous dispersion described in Example I. The coated plate was dried, contact exposed, developed with water, and run on press as described in Example III. The plate printed 12,000 impressions using a coarse ink without failure of the adhesion between any of the layers at any of the interfaces.

EXAMPLE V

This example demonstrates the formation of a lithographic plate wherein the substrate has a roughened surface.

A composition for forming the oleophilic layer was prepared by combining the following ingredients in the amounts indicated:

| Ingredient | Amount |
| --- | --- |
| Pentaerythritol tetraacrylate | 22 g |
| Ethylenically urethane oligomer (49% in methylethyl ketone) ("Polymethacrylated Urethane Oligomer B", U.S. Pat. No. 4,304,923) | 25 g |
| Triethylamine | 1 g |
| Pthalocyanine Blue | 1 g |
| Polyvinyl formal (Formvar ® 7/95E, available from Monsanto Company) | 6 g |
| Polyvinyl butyral (Butvar ® B76, available from Monsanto Company) | 3 g |
| Diphenyliodonium hexafluorophosphate | 2 g |
| Michler's ketone (4,4'-Bis(dimethylamino)-benzophenone) | 4 g |
| Ethylene dichloride | 488 g |

The foregoing composition was applied with a #8 wire round rod to an aluminum substrate that had been chemically etched with ammonium bifluoride and anodized. The resulting coating was dried for two minutes at 66° C. (150° F.) and then irradiated for 5 seconds at a distance of 20.3 cm (8 inches) from a 5 KW mercury metal halide lamp. The uncoated aluminum substrate had an arithmetic average roughness of about 40 microinches (1.0 micrometer). The coated aluminum substrate had an arithmetic average roughness of about 34 microinches (0.89 micrometer).

A dispersion for preparing the hydrophilic top coat was prepared by combining the following ingredients in the amounts indicated.

| Ingredient | Amount |
| --- | --- |
| Acrylamidomethyl dextrin (D.S. = 0.32, prepared from Stadex ® 140) | 3.0 g |
| Water | 30.0 g |
| Octylphenoxy polyethoxy ethanol (10% aqueous solution) (Triton ® X-100) | 0.2 g |
| Colanyl Red pigment (50% solids) | 0.9 g |
| 1,3-Diacrylamido-2-hydroxypropane | 1.3 g |
| 1-Acrylamido-2,3-dihydroxypropane (31% aqueous solution) | 2.1 g |
| Diphenyliodomium hexafluorophosphate | 0.1 g |
| 4,4'-Bis-(N—2-carboxyethyl-N—methylamino) benzophenone disodium salt (2% aqueous solution) | 7.7 g |
| Silica gel (Syloid ® 244) | 1.9 g |

The dispersion was prepared by combining the foregoing components, except for the iodonium salt and the benzophenone derivative, and milling for four days in a vessel containing glass marbles. After this period, the remaining two components were added to the dispersion, which was milled for an additional 1.5 hours.

The dispersion was coated over the oleophilic layer described previously with a #9 wire round rod and dried for 2 minutes at 66° C. (150° F.). The coating weight was about 3.00 g/m² (280 mg/ft²).

The coated plate was exposed in a vacuum frame through a lith film transparency with a range of half tone screens and a 21 step sensitivity guide. After exposure, the plate was developed with water. Upon application of water and ink, a positive image with a ghost step 5–6 on the sensitivity guide was obtained. The plate was run on a Miehle sheet fed press, using a coarse ink. Over 9000 good copies were prepared before any sign of wear was visible.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A positive-acting lithographic plate comprising a substrate, an oleophilic layer bonded to said substrate, and a water soluble photosensitive layer adhered to said oleophilic layer, said water soluble photosensitive layer when imagewise exposed to radiation, reacting in the exposed areas to provide an insoluble, water-receptive, ink-repellent surface corresponding with the radiation struck areas while remaining soluble and readily removable in the unexposed areas, said water soluble photosensitive layer being formed from a composition comprising (a) an ethylenically unsaturated dextrin oligomer having a degree of substitution of about 0.20 to about 0.45, (b) at least one hydroxyfunctional acrylamide monomer, (c) inorganic particulate material, and (d) a photoinitiation system, wherein the composite formed by the substrate and the overlying oleophilic layer exhibits a surface roughness as measured over the surface of the oleophilic layer corresponding to an arithmetic average roughness of about 0.64 to about 1.00 micrometer.

2. The plate of claim 1 wherein the substrate is selected from the group consisting of metals and synthetic polymeric materials.

3. The plate of claim 1 wherein the dextrin oligomer has the formula

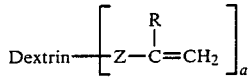

wherein

"Dextrin" is a carbohydrate intermediate in chain length between starch and glucose, Z is an organo linking group having up to 9 atoms selected from carbon, nitrogen, and oxygen, "a" represents the degree of substitution and has a value of 0.20 to 0.45, and R is a member selected from the group consisting of hydrogen and lower alkyl radicals, wherein said radicals have from 1 to 4 carbon atoms.

4. The plate of claim 3 wherein Z is selected from the group consisting of

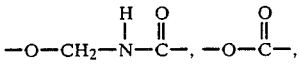

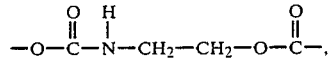

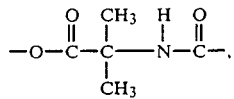

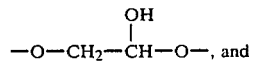

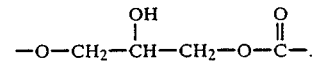

5. The plate of claim 1 wherein the hydroxyfunctional monomer is a mixture of at least one monoacrylamide monomer and at least one polyacrylamide monomer.

6. The plate of claim 5 wherein the hydroxyfunctional monomers are 2,3-dihydroxy-1-acrylamidopropane and 1,3-diacrylamide-2-hydroxypropane.

7. The plate of claim 1 wherein the inorganic particulate material is a silica gel.

8. The plate of claim 1 wherein the photoinitiation system comprises:
(a) a water soluble Michler's ketone analog
(b) a diaryliodonium salt.

9. The plate of claim 1 wherein the composition for forming the hydrophilic layer further includes a wetting agent.

10. The plate of claim 9 wherein the composition for forming the hydrophilic layer further includes a pH modifier.

11. The plate of claim 1 wherein the composition for forming the hydrophilic layer comprises from about 20 to about 60 parts by weight of an ethylenically unsaturated dextrin oligomer, from about 10 to about 30 parts by weight of at least one hydroxyfunctional acrylamide monomer, from about 10 to about 40 parts by weight of inorganic particulate material, from about 1 part to about 7 parts by weight photoinitiation system.

* * * * *

UNITED STATES PATENT AND TRADEMARK OFFICE
CERTIFICATE OF CORRECTION

PATENT NO. : 4,507,382
DATED : March 26, 1985
INVENTOR(S) : Alan D. Rousseau, Elsie A. Fohrenkamm, William L. Kausch It is certified that error appears in the above-identified patent and that said Letters Patent is hereby corrected as shown below:

Col. 4, line 37, "assignee'3" should read --assignee's--.

Col. 12, line 25, "salt" should read --salt of--.

Signed and Sealed this

Thirteenth Day of August 1985

[SEAL]

Attest:

DONALD J. QUIGG

Attesting Officer　　Acting Commissioner of Patents and Trademarks